(12) United States Patent
Liu et al.

(10) Patent No.: US 7,128,825 B2
(45) Date of Patent: *Oct. 31, 2006

(54) METHOD AND COMPOSITION FOR POLISHING A SUBSTRATE

(75) Inventors: Feng Q. Liu, San Jose, CA (US); Stan D. Tsai, Fremont, CA (US); Yongqi Hu, Campbell, CA (US); Siew S. Neo, Santa Clara, CA (US); Yan Wang, Sunnyvale, CA (US); Alain Duboust, Sunnyvale, CA (US); Liang-Yuh Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 292 days.

This patent is subject to a terminal disclaimer.

(21) Appl. No.: 10/378,097

(22) Filed: Feb. 26, 2003

(65) Prior Publication Data

US 2003/0178320 A1 Sep. 25, 2003

Related U.S. Application Data

(63) Continuation-in-part of application No. 10/038,066, filed on Jan. 3, 2002, now Pat. No. 6,811,680, and a continuation-in-part of application No. 10/032,275, filed on Dec. 21, 2001, now Pat. No. 6,899,804.

(60) Provisional application No. 60/359,746, filed on Feb. 26, 2002, provisional application No. 60/275,874, filed on Mar. 14, 2001.

(51) Int. Cl.
*C25F 3/00* (2006.01)

(52) U.S. Cl. ...................... 205/668; 205/674; 205/682; 205/684

(58) Field of Classification Search ................ 205/668, 205/674, 682, 684
See application file for complete search history.

(56) References Cited

U.S. PATENT DOCUMENTS

| 2,582,020 A | 1/1952 | Emery ..................... 204/140.5 |
| 3,239,441 A | 3/1966 | Marosi |
| 3,873,512 A | 3/1975 | Latanision ............. 204/129.46 |

(Continued)

FOREIGN PATENT DOCUMENTS

EP 0 527 537 2/1993

(Continued)

OTHER PUBLICATIONS

Robert J. Contolini, "Electrochemical Planarization of ULSI Copper" Jun. 1997, Solid State Technology, pp. 155-156, 158, 160.

(Continued)

*Primary Examiner*—Patrick Joseph Ryan
*Assistant Examiner*—Thomas H. Parsons
(74) *Attorney, Agent, or Firm*—Patterson and Sheridan

(57) ABSTRACT

Polishing compositions and methods for removing conductive materials from a substrate surface are provided. In one aspect, a composition includes an acid based electrolyte system, one or more chelating agents, one or more corrosion inhibitors, one or more inorganic or organic acid salts, one or more pH adjusting agents to provide a pH between about 3 and about 10, a polishing enhancing material selected from the group of abrasive particles, one or more oxidizers, and combinations thereof, and a solvent. The composition may be used in an conductive material removal process including disposing a substrate having a conductive material layer formed thereon in a process apparatus comprising an electrode, providing the composition between the electrode and substrate, applying a bias between the electrode and the substrate, and removing conductive material from the conductive material layer.

29 Claims, 1 Drawing Sheet

U.S. PATENT DOCUMENTS

| | | |
|---|---|---|
| 4,263,113 A | 4/1981 | Bernard .................. 204/146 |
| 4,369,909 A | 1/1983 | Grzeika .................. 227/109 |
| 4,663,005 A | 5/1987 | Edson .................. 204/129.85 |
| 4,666,683 A | 5/1987 | Brown et al. .................. 423/24 |
| 4,793,895 A | 12/1988 | Kaanta et al. .............. 156/627 |
| 4,934,102 A | 6/1990 | Leach et al. ................ 51/50 R |
| 4,992,135 A | 2/1991 | Doan .................. 156/636 |
| 5,002,645 A | 3/1991 | Eastland et al. ....... 204/157.42 |
| 5,096,550 A | 3/1992 | Mayer et al. ............ 204/129.1 |
| 5,114,548 A | 5/1992 | Rhoades .............. 204/129.46 |
| 5,129,981 A | 7/1992 | Wang et al. ................ 156/628 |
| 5,209,816 A | 5/1993 | Yu et al. .................. 156/636 |
| 5,217,586 A | 6/1993 | Datta et al. .............. 204/129.6 |
| 5,225,034 A | 7/1993 | Yu et al. .................. 156/636 |
| 5,256,565 A | 10/1993 | Bernhardt et al. .......... 437/228 |
| 5,340,370 A | 8/1994 | Cadien et al. ................ 51/308 |
| 5,391,258 A | 2/1995 | Branacaleoni et al. ...... 156/636 |
| 5,407,526 A | 4/1995 | Danielson et al. .......... 156/636 |
| 5,534,106 A | 7/1996 | Cote et al. ................ 156/636.1 |
| 5,543,032 A | 8/1996 | Datta et al. .................. 205/670 |
| 5,567,300 A | 10/1996 | Datta et al. .................. 205/652 |
| 5,575,706 A | 11/1996 | Tsai et al. .................... 451/41 |
| 5,770,095 A | 6/1998 | Sasaki et al. ................ 216/38 |
| 5,783,489 A | 7/1998 | Kaufman et al. ........... 438/692 |
| 5,800,577 A | 9/1998 | Kido .......................... 51/307 |
| 5,804,507 A | 9/1998 | Tolles et al. ................. 438/692 |
| 5,807,165 A | 9/1998 | Uzoh et al. .................... 451/41 |
| 5,843,032 A | 12/1998 | Kastenhofer ................ 604/96 |
| 5,846,882 A | 12/1998 | Birang ....................... 438/692 |
| 5,866,031 A | 2/1999 | Carprio et al. ............. 252/79.1 |
| 5,880,003 A | 3/1999 | Hayashi .................... 438/405 |
| 5,897,375 A * | 4/1999 | Watts et al. ................. 438/693 |
| 5,911,619 A | 6/1999 | Uzoh et al. ..................... 451/5 |
| 5,954,997 A | 9/1999 | Kaufman et al. ........... 252/79.1 |
| 5,965,036 A | 10/1999 | Maki et al. ................. 216/106 |
| 6,001,730 A | 12/1999 | Farkas et al. ............... 438/627 |
| 6,004,880 A | 12/1999 | Liu et al. .................... 438/692 |
| 6,056,864 A | 5/2000 | Cheung ....................... 205/222 |
| 6,063,306 A | 5/2000 | Kaufman et al. ........... 252/79.4 |
| 6,066,030 A | 5/2000 | Uzoh .......................... 451/41 |
| 6,068,879 A | 5/2000 | Pasch .......................... 427/97 |
| 6,074,284 A | 6/2000 | Tani et al. |
| 6,077,412 A | 6/2000 | Ting et al. .................. 205/143 |
| 6,083,840 A | 7/2000 | Mravic et al. .............. 438/693 |
| 6,090,239 A | 7/2000 | Liu et al. .................... 156/345 |
| 6,096,652 A | 8/2000 | Watts et al. ................. 438/692 |
| 6,099,604 A | 8/2000 | Sandhu et al. ................ 51/307 |
| 6,103,096 A | 8/2000 | Datta et al. ................. 205/686 |
| 6,106,728 A | 8/2000 | Iida et al. .................... 210/743 |
| 6,117,775 A | 9/2000 | Kondo et al. ............... 438/690 |
| 6,117,783 A | 9/2000 | Small et al. ................. 438/693 |
| 6,117,853 A | 9/2000 | Sakai et al. .................... 514/78 |
| 6,121,152 A | 9/2000 | Adams et al. ............... 438/697 |
| 6,126,798 A | 10/2000 | Reid et al. .................. 204/282 |
| 6,126,853 A | 10/2000 | Kaufman et al. ........... 252/79.1 |
| 6,139,763 A | 10/2000 | Ina et al. ..................... 216/89 |
| 6,143,155 A | 11/2000 | Adams et al. ................ 205/87 |
| 6,143,656 A | 11/2000 | Yang et al. ................. 438/687 |
| 6,153,043 A | 11/2000 | Edelstein et al. ........... 156/345 |
| 6,171,352 B1 | 1/2001 | Lee et al. ..................... 51/307 |
| 6,176,992 B1 | 1/2001 | Talieh ........................ 205/87 |
| 6,177,026 B1 | 1/2001 | Wang et al. ................ 252/79.1 |
| 6,190,237 B1 | 2/2001 | Huyng et al. ................. 451/41 |
| 6,194,317 B1 | 2/2001 | Kaisaki et al. .............. 438/692 |
| 6,206,756 B1 | 3/2001 | Chopra et al. ................ 451/28 |
| 6,217,416 B1 | 4/2001 | Kaufman et al. .............. 451/41 |
| 6,218,305 B1 | 4/2001 | Hosali et al. ................ 438/691 |
| 6,234,870 B1 | 5/2001 | Uzoh et al. ..................... 451/8 |
| 6,238,592 B1 | 5/2001 | Hardy et al. ............... 252/79.1 |
| 6,248,222 B1 | 6/2001 | Wang .................... 204/297.09 |
| 6,258,711 B1 | 7/2001 | Laursen et al. ............. 438/633 |
| 6,258,721 B1 | 7/2001 | Li et al. ..................... 438/693 |
| 6,273,786 B1 | 8/2001 | Chopra et al. ................ 451/28 |
| 6,276,996 B1 | 8/2001 | Chopra ....................... 451/41 |
| 6,280,598 B1 | 8/2001 | Barton et al. ............... 205/210 |
| 6,296,400 B1 | 10/2001 | Uchiyama et al. ............ 385/94 |
| 6,299,741 B1 | 10/2001 | Sun et al. ............... 204/224 M |
| 6,303,049 B1 | 10/2001 | Lee et al. ................... 252/79.1 |
| 6,303,551 B1 | 10/2001 | Li et al. ..................... 510/175 |
| 6,310,019 B1 | 10/2001 | Kakizawa et al. ........... 510/175 |
| 6,315,803 B1 | 11/2001 | Ina et al. ..................... 51/307 |
| 6,315,883 B1 | 11/2001 | Mayer et al. ................ 205/123 |
| 6,348,076 B1 | 2/2002 | Canaperi et al. .............. 51/309 |
| 6,354,916 B1 | 3/2002 | Uzoh et al. .................... 451/41 |
| 6,355,075 B1 | 3/2002 | Ina et al. ..................... 51/308 |
| 6,355,153 B1 | 3/2002 | Uzoh et al. .................... 205/87 |
| 6,361,422 B1 | 3/2002 | Ettinger et al. .............. 451/339 |
| 6,375,693 B1 | 4/2002 | Cote et al. .................... 51/308 |
| 6,379,223 B1 | 4/2002 | Sun et al. ..................... 451/41 |
| 6,391,166 B1 | 5/2002 | Wang .................... 204/224 R |
| 6,395,152 B1 | 5/2002 | Wang .................... 204/224 M |
| 6,402,925 B1 | 6/2002 | Talieh |
| 6,416,685 B1 | 7/2002 | Zhang et al. ............... 252/79.1 |
| 6,419,554 B1 | 7/2002 | Chopra et al. ................ 451/41 |
| 6,428,721 B1 | 8/2002 | Ina et al. .................... 252/79.4 |
| 6,429,133 B1 | 8/2002 | Chopra ...................... 438/692 |
| 6,440,186 B1 | 8/2002 | Sakai et al. ................... 51/308 |
| 6,440,295 B1 | 8/2002 | Wang ........................ 205/640 |
| 6,447,371 B1 | 9/2002 | Brusic Kaufman et al. ... 451/36 |
| 6,447,668 B1 | 9/2002 | Wang ........................ 205/645 |
| 6,454,819 B1 | 9/2002 | Yano et al. ................... 51/298 |
| 6,455,479 B1 | 9/2002 | Sahbari ..................... 510/175 |
| 6,508,952 B1 | 1/2003 | Lee et al. .................. 252/79.1 |
| 6,541,384 B1 | 4/2003 | Sun et al. ................... 438/692 |
| 6,551,935 B1 | 4/2003 | Sinha et al. ................ 438/693 |
| 6,555,158 B1 | 4/2003 | Yoshio et al. ................. 427/97 |
| 6,562,719 B1 | 5/2003 | Kondo et al. ............... 438/691 |
| 6,565,619 B1 | 5/2003 | Asano et al. ................. 51/308 |
| 6,568,997 B1 * | 5/2003 | Costas et al. .................. 451/41 |
| 6,569,349 B1 | 5/2003 | Wang et al. ............... 252/79.1 |
| 6,579,153 B1 | 6/2003 | Uchikura et al. ............. 451/41 |
| 6,582,579 B1 | 6/2003 | Uzoh |
| 6,592,742 B1 | 7/2003 | Sun et al. ................... 205/651 |
| 6,593,239 B1 | 7/2003 | Kaufman et al. ........... 438/692 |
| 6,596,152 B1 | 7/2003 | Yang et al. |
| 6,596,638 B1 | 7/2003 | Kondo et al. ............... 438/690 |
| 6,602,112 B1 | 8/2003 | Tran et al. .................... 451/36 |
| 6,605,537 B1 | 8/2003 | Bian et al. .................. 438/691 |
| 6,613,200 B1 | 9/2003 | Li et al. ..................... 204/198 |
| 6,616,976 B1 | 9/2003 | Montano et al. ............ 427/327 |
| 6,620,215 B1 | 9/2003 | Li et al. ....................... 51/298 |
| 6,653,242 B1 | 11/2003 | Sun et al. ................... 438/738 |
| 6,676,484 B1 | 1/2004 | Chopra ......................... 451/7 |
| 6,679,928 B1 | 1/2004 | Costas et al. .................. 51/307 |
| 6,679,929 B1 | 1/2004 | Asano et al. ................. 51/308 |
| 6,693,036 B1 | 2/2004 | Nogami et al. ............. 438/692 |
| 6,699,299 B1 | 3/2004 | Sachan et al. |
| 6,736,952 B1 | 5/2004 | Emesh et al. |
| 6,756,307 B1 | 6/2004 | Kelly et al. |
| 6,811,680 B1 | 11/2004 | Chen et al. ................. 205/662 |
| 6,821,409 B1 | 11/2004 | Basol et al. |
| 6,821,881 B1 | 11/2004 | Tsai et al. ................... 438/626 |
| 6,837,983 B1 | 1/2005 | Duboust et al. ............ 205/645 |
| 6,846,227 B1 | 1/2005 | Sato et al. |
| 6,852,630 B1 | 2/2005 | Basol et al. |
| 6,867,136 B1 | 3/2005 | Basol et al. |
| 6,893,476 B1 | 5/2005 | Siddiqui et al. |
| 6,899,804 B1 | 5/2005 | Duboust et al. ............ 205/650 |
| 6,902,659 B1 | 6/2005 | Talieh |
| 6,943,112 B1 | 9/2005 | Basol et al. |
| 6,946,066 B1 | 9/2005 | Basol et al. |
| 2001/0016469 A1 | 8/2001 | Chopra |
| 2001/0024878 A1 | 9/2001 | Nakamura |
| 2001/0036746 A1 | 11/2001 | Sato et al. .................. 438/745 |

| | | |
|---|---|---|
| 2001/0042690 A1 | 11/2001 | Talieh |
| 2001/0052351 A1 | 12/2001 | Brown et al. |
| 2002/0008036 A1 | 1/2002 | Wang .................. 205/118 |
| 2002/0016065 A1 | 2/2002 | Komai et al. |
| 2002/0016073 A1 | 2/2002 | Kondo et al. |
| 2002/0016272 A1 | 2/2002 | Kakizawa et al. |
| 2002/0040100 A1 | 4/2002 | Kume et al. .................. 525/89 |
| 2002/0070126 A1 | 6/2002 | Sato et al. .................. 205/640 |
| 2002/0072309 A1 | 6/2002 | Sato et al. .................. 451/41 |
| 2002/0074230 A1 | 6/2002 | Basol .................. 205/93 |
| 2002/0088709 A1 | 7/2002 | Hongo et al. |
| 2002/0096659 A1 | 7/2002 | Sakai et al. |
| 2002/0104764 A1 | 8/2002 | Gautam et al. |
| 2002/0108861 A1 | 8/2002 | Emesh et al. |
| 2002/0108864 A1 | 8/2002 | Yang et al. |
| 2002/0119286 A1 | 8/2002 | Chen et al. |
| 2002/0130049 A1 | 9/2002 | Chen et al. |
| 2002/0139055 A1 | 10/2002 | Asano et al. |
| 2002/0160698 A1 | 10/2002 | Sato et al. .................. 451/67 |
| 2002/0182982 A1 | 12/2002 | Jui-Lung et al. |
| 2003/0019755 A1 | 1/2003 | Hey et al. |
| 2003/0038038 A1 | 2/2003 | Basol et al. |
| 2003/0073311 A1 | 4/2003 | Joseph et al. |
| 2003/0073386 A1 | 4/2003 | Ma et al. |
| 2003/0079416 A1 | 5/2003 | Ma et al. |
| 2003/0083214 A1 | 5/2003 | Kakizawa et al. |
| 2003/0104762 A1 | 6/2003 | Sato et al. .................. 451/9 |
| 2003/0113996 A1 | 6/2003 | Nogami et al. ............. 438/638 |
| 2003/0114004 A1 | 6/2003 | Sato et al. .................. 438/689 |
| 2003/0115475 A1 | 6/2003 | Russo et al. |
| 2003/0116445 A1 | 6/2003 | Sun et al. |
| 2003/0116446 A1 | 6/2003 | Duboust et al. |
| 2003/0119311 A1 | 6/2003 | Basol et al. |
| 2003/0136055 A1 | 7/2003 | Li et al. |
| 2003/0153184 A1 | 8/2003 | Wang et al. |
| 2003/0170091 A1 | 9/2003 | Shomler et al. |
| 2003/0178320 A1 | 9/2003 | Liu et al. |
| 2003/0216045 A1 | 11/2003 | Wang et al. |
| 2003/0234184 A1 | 12/2003 | Liu et al. |
| 2004/0053499 A1 | 3/2004 | Liu et al. |
| 2004/0144038 A1 | 7/2004 | Siddiqui et al. |
| 2004/0231994 A1 | 11/2004 | Basol et al. |
| 2004/0248412 A1 | 12/2004 | Liu et al. |
| 2005/0044803 A1 | 3/2005 | Siddiqui et al. |
| 2005/0056537 A1 | 3/2005 | Chen et al. |
| 2005/0076578 A1 | 4/2005 | Siddiqul et al. |
| 2005/0076579 A1 | 4/2005 | Siddiqul et al. |
| 2005/0079718 A1 | 4/2005 | Siddiqul et al. |
| 2005/0079803 A1 | 4/2005 | Siddiqui et al. |
| 2005/0145507 A1 | 7/2005 | Sun et al. |
| 2005/0218010 A1 | 10/2005 | Wang et al. |
| 2005/0227483 A1 | 10/2005 | Basol et al. |
| 2006/0006074 A1 | 1/2006 | Liu et al. |
| 2006/0009033 A1 | 1/2006 | Basol et al. |
| 2006/0011485 A1 | 1/2006 | Basol et al. |

FOREIGN PATENT DOCUMENTS

| | | |
|---|---|---|
| EP | 0 699 782 | 3/1996 |
| EP | 0 811 665 A3 | 12/1997 |
| EP | 0 846 742 A2 | 6/1998 |
| EP | 1 103 346 A2 | 5/2001 |
| EP | 1 167 585 | 1/2002 |
| EP | 1 170 761 A1 | 9/2002 |
| EP | 1 410430 | 4/2004 |
| JP | 58-093886 | 6/1983 |
| JP | 58-093899 | 6/1983 |
| JP | 05-302199 | 11/1993 |
| JP | 06-158397 | 6/1994 |
| JP | 10-121297 | 5/1998 |
| JP | 2000-192298 | 7/2000 |
| JP | 2000-256898 | 9/2000 |
| JP | P2001-77117 A | 3/2001 |
| SU | 1 618 538 A1 | 1/1991 |
| WO | 98/04646 | 2/1998 |
| WO | 98/49723 | 11/1998 |
| WO | WO 99/46081 | 9/1999 |
| WO | WO 99/46353 | 9/1999 |
| WO | 99/53532 | 10/1999 |
| WO | 99/65072 | 12/1999 |
| WO | 99 65072 A1 | 12/1999 |
| WO | 00/03426 | 1/2000 |
| WO | 00/26443 | 5/2000 |
| WO | 00 55876 A1 | 9/2000 |
| WO | 07/7241 A2 | 10/2001 |
| WO | WO 01/77241 * | 10/2001 |
| WO | 02/23616 | 3/2002 |
| WO | 02 075804 A2 | 9/2002 |
| WO | 02/88229 | 11/2002 |
| WO | WO 03/009361 | 1/2003 |
| WO | WO 03/060962 | 7/2003 |
| WO | WO 03/087436 | 10/2003 |
| WO | WO 03/088316 | 10/2003 |

OTHER PUBLICATIONS

International Search Report for PCT/US02/40754 dated Apr. 28, 2003.

Nogami, "*An Innovation to Integrate Porous Low-K Materials and Copper*", *InterConnect Japan 2001*; Honeywell Seminar (Dec. 6, 2001) pp. 1-12.

International Search Report for PCT/US02/04806 dated Apr. 1, 2003.

D. Landolt, "Fundamental Aspects of Electropolishing", Mar. 18, 1996, pp.: 1-11.

Partial International Search Report for PCT/US02/40754 dated Apr. 28, 2003.

U.S. Appl. No. 10/141,459, filed May 7, 2002 (5998.P1).

PCT International Search Report for US 03/06058 dated Jun. 25, 2003.

PCT Written Opinion for PCT/US03/06058, dated Feb. 13, 2004 (AMAT/5699-PC.02).

PCT Written Opinion for PCT/US02/04806, dated Mar. 9, 2004 (AMAT/5699.PC).

PCT International Preliminary Examination Report for PCT/US02/04806, dated Sep. 7, 2004. (AMAT/5699.PC).

PCT International Preliminary Examination Report for PCT/US03/06058, dated Sep. 7, 2004. (AMAT/5699.PC.02).

PCT International Search Report for PCT/US04/17691, dated Nov. 11, 2004. (AMAT/5699.PCT03).

PCT Written Opinion for PCT/US04/17691, dated Nov. 11, 2004. (AMAT/5699.PCT03).

Chang, et al., "Microleveling Mechanisms and Applications of Electropolishing of Planarization of Copper Mettalization", *J. Vac. Sci. Technol. B 20(5)*, Sep./Oct. 2002, pp. 2149-2152.

Chang, et al., "Superpolishing of Planarizing Copper Damascene Interconnects", *Electrochemical and Solid-State Letters*, pp. G72-G74.

Contolini, et al., "Electrochemical Planarization for Multilevel Metallization", *J. Electrochem. Soc.*, vol. 141, No. 9, Sep. 1994, pp. 2503-2510.

Contolini, et al., "Electrochemical Planarization of ULSI Copper", *Solid State Technology*, Jun. 1997, pp. 1-7.

Du, et al., Mechanism of Copper Removal During CMP in Acidic H2O2 Slurry, *Journal of The Electrochemical Society*, pp. G230-235 (2004).

Hu, et al., "Copper Interconnection Integration and Reliability", *Thin Solid State Films*, pp. 84-92, (1995).

International Search Report for PCT/US02/40754 dated Aug. 5, 2003. (AMAT/5998PC).

Jin-Hua, et al., "An XPS and BAW Sensor Study of the Structure and Real-Time Growth Behavious of a Complex Surface Film on Copper in Sodium Chloride Solutions (pH=9), Containing a Low Concentration of Benzotriazole", *Electrochimica Acta*, vol. 43, Nos. 3-4, pp. 265-274, 1998.

Kaufman, et al., "Chemical-Mechanical Polishing for Fabricating Patterned W Metal Features as Chip Interconnects", *J. Electrochem. Soc.*, vol. 138, No. 11, Nov. 1994; The Electrochemical Society, Inc. pp. 3460-3465.

Padhi, et al., "Planarization of Copper Thin Films by Electropolishing in Phosphoric Acid for ULSI Applications", *Journal of the Electrochemical Society*, 150, pp. G10-G14.

Qafsaoui, et al., "Quantitative Characterization of Protective Films Grown on Copper in the Presence of Different Triazole Derivative Inhibitors", *Electrochimica Acta 47* (2002), pp. 4339-4346.

Steigerwald, et al., "Effect of Copper Ions in the Slurry on the Chemical-Mechanical Polish Rate of Titanium", *J. Electrochem. Soc.*, vol. 141, No. 12, Dec. 1994, pp. 3512-3516.

Tamilmani, et al., "Potential-pH Diagrams of Interest to Chemical Mechanical Planarization of Copper", *Journal of The Electrochemical Society*, V. 149, pp. G638-G642 (2002).

Tromans, et al., "Growth of Passivating CuBTA Films on Copper in Aqueous Chloride/Benzotriazole Solutions", *Electrochemical and Solid-State Letter*, V. 5, pp. B5-B8 (2002).

Wang, et al., "Inhibition Effect of AC-Treated, Mixed Self-Assembled Film of Phenylthiourea and 1-Dodecanethiol on Copper Corrosion", *Journal of The Electrochemical Society*, pp. B11-B15 (2004).

PCT International Search Report for PCT/US02/04806, dated Apr. 1, 2003 (AMAT/5699.PC).

Takeshi Nogami, "An Innovation to Integrate Porous Low-K Materials and Copper" Interconnect Japan (2001) 13 pages.

\* cited by examiner

METHOD AND COMPOSITION FOR POLISHING A SUBSTRATE

CROSS-REFERENCE TO RELATED APPLICATIONS

This application claims priority to U.S. Provisional Patent Application Ser. No. 60/359,746, filed Feb. 26, 2002, entitled "Copper CMP Slurries With Organic Polymer Particles," which application is herein incorporated by reference. This application is also a continuation-in-part of co-pending U.S. patent application Ser. No. 10/032,275, filed Dec. 21, 2001 now U.S. Pat. No. 6,899,804, entitled "Polishing Composition and Treatment for Electrolytic Chemical Mechanical Polishing," and a continuation-in-part of co-pending U.S. patent application Ser. No. 10/038,066, filed Jan. 3, 2002, entitled "Planarization Of Substrates Using Electrochemical Mechanical Polishing," now U.S. Pat. No. 6,811,680, which claims priority to U.S. Provisional Patent Application Ser. No. 60/275,874, filed on Mar. 14, 2001.

BACKGROUND OF THE INVENTION

1. Field of the Invention

Embodiments of the present invention relate to compositions and methods for removing a conductive material from a substrate.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of interconnects is important to VLSI and ULSI success and to the continued effort to increase circuit density and quality of individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process where material is removed from the surface of the substrate to form a generally even, planar surface. Planarization is useful in removing excess deposited material and removing undesired surface topography and surface defects, such as rough surfaces, agglomerated materials, crystal lattice damage, scratches, and contaminated layers or materials to provide an even surface for subsequent lithography and processing.

Electrochemical mechanical polishing (ECMP) is one method of planarizing a surface of a substrate. ECMP removes conductive materials, such as copper, from a substrate surface by electrochemical "anodic" dissolution while polishing the substrate with a reduced mechanical abrasion compared to conventional chemical mechanical planarization (CMP) processes. A typical ECMP system includes a substrate support and two electrodes disposed within a polishing composition containment basin. The substrate is in electrical contact with one of the electrodes, and in effect during processing, the substrate becomes an electrode for material removal. In operation, metal atoms on a surface of a substrate are ionized by an electrical current from a source of potential, such as a voltage source connected to the two electrodes. The metal ions dissolve into the surrounding polishing composition.

However, ECMP processes typically have been observed to have reduced removal rates compared to conventional chemical mechanical polishing processes, and modifying processing conditions, such as increasing pressure between a substrate and polishing pad and increasing processing time, to improve removal rate have not proven to be satisfactory in increasing removal rates and in some instances, increased dishing and increased damage to the substrate surface. For example, increased polishing pressure on substrate containing low dielectric constant (low k dielectric) materials have been observed to form defects in the deposited material, such as delamination or scratches from increased shear forces derived from increased polishing pressures.

Therefore, there is a need for compositions and methods for removing conductive material from a substrate that minimizes damage to the substrate during planarization.

SUMMARY OF THE INVENTION

Aspects of the invention provide compositions and methods for removing conductive materials by an electrochemical polishing technique. In one aspect, a composition is provided for removing at least a conductive material from a substrate surface including an acid based electrolyte system, one or more chelating agents, one or more corrosion inhibitors, one or more inorganic or organic acid salts, one or more pH adjusting agents to provide a pH between about 3 and about 10, a polishing enhancing material selected from the group of abrasive particles, one or more oxidizers, and combinations thereof, and a solvent.

In another aspect, the composition is used in a method provided for processing a substrate including disposing a substrate having a conductive material layer formed thereon in a process apparatus comprising a first electrode and a second electrode, wherein the substrate in electrical contact with the second electrode, providing the composition between the first electrode and the substrate, applying a bias between the first electrode and the second electrode, and removing conductive material from the conductive material layer.

BRIEF DESCRIPTION OF THE DRAWINGS

So that the manner in which the above recited aspects of the present invention are attained and can be understood in detail, a more particular description of embodiments of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
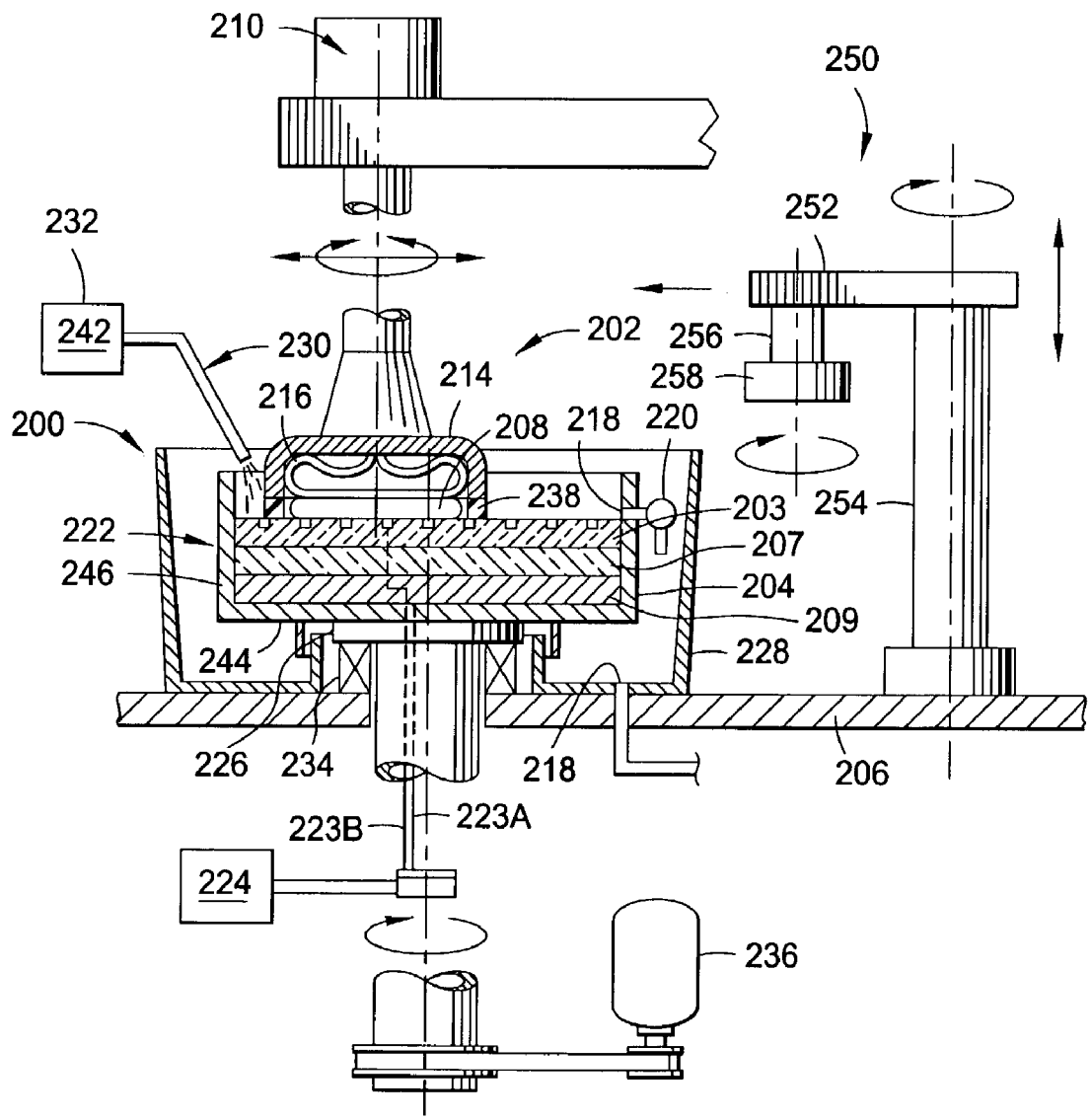
FIG. 1 is a cross-sectional view of one embodiment of a polishing process station.

In general, aspects of the invention provide compositions and methods for removing at least a conductive material from a substrate surface. The invention will be described below in reference to a planarizing process for the removal of conductive materials from a substrate surface by an electrochemical mechanical polishing (ECMP) technique.

The words and phrases used herein should be given their ordinary and customary meaning in the art by one skilled in the art unless otherwise further defined. Chemical polishing should be broadly construed and includes, but is not limited to, planarizing a substrate surface using chemical activity. Electropolishing should be broadly construed and includes, but is not limited to, planarizing a substrate by the application of electrochemical activity. Electrochemical mechanical polishing (ECMP) should be broadly construed and includes, but is not limited to, planarizing a substrate by the application of electrochemical activity, mechanical activity, or a combination of both electrochemical and mechanical activity to remove material from a substrate surface.

Anodic dissolution should be broadly construed and includes, but is not limited to, the application of an anodic bias to a substrate directly or indirectly which results in the removal of conductive material from a substrate surface and into a surrounding polishing composition. Polishing composition should be broadly construed and includes, but is not limited to, a composition that provides ionic conductivity, and thus, electrical conductivity, in a liquid medium. Percentages of electrolyte components in polishing compositions by volume or weight refer to percentages based on volume for liquid composition components and percentages based on weight for solid composition components.

One Apparatus Embodiment

FIG. 1 depicts a cross-sectional view of one embodiment of a "face-down" process cell 200. The process cell 200 generally includes a basin 204 and a polishing head 202. A substrate 208 is retained in the polishing head 202 and lowered into the basin 204 during processing in a face-down (e.g., backside up) orientation. An electrolyte, such as described herein is flowed into the basin 204 and in contact with the substrate's surface and a pad assembly 222, while the polishing head 202 places the substrate 208 in contact with the pad assembly 222. The basin 204 includes the pad assembly 222, a bottom 244 and sidewalls 246 that define a container that houses the pad assembly 222. The sidewalls 246 include a port 218 formed therethrough to allow removal of polishing composition from the basin 204. The port 218 is coupled to a valve 220 to selectively drain or retain the polishing composition in the basin 204.

The substrate 208 and the pad assembly 222 disposed in the basin 204 are moved relative to each other to provide a polishing motion (or motion that enhances plating uniformity). The polishing motion generally comprises at least one motion defined by an orbital, rotary, linear or curvilinear motion, or combinations thereof, among other motions. The polishing motion may be achieved by moving either or both of the polishing head 202 and/or the basin 204. The polishing head 202 may be stationary or driven to provide at least a portion of the relative motion between the basin 204 and the substrate 208 held by the polishing head 202. In the embodiment depicted in FIG. 1, the polishing head 202 is coupled to a drive system 210. The drive system 210 moves the polishing head 202 with at least a rotary, orbital, sweep motion or combinations thereof.

The polishing head 202 generally retains the substrate 208 during processing. In one embodiment, the polishing head 202 includes a housing 214 enclosing a bladder 216. The bladder 216 may be deflated when contacting the substrate to create a vacuum therebetween, thus securing the substrate to the polishing head 202. The bladder 216 may additionally be inflated to press the substrate in contact with the pad assembly 222 retained in the basin 204. A retaining ring 238 is coupled to the housing 214 and circumscribes the substrate 208 to prevent the substrate from slipping out from the polishing head 202 while processing. One polishing head that may be adapted to benefit from the invention is a TITAN HEAD™ carrier head available from Applied Materials, Inc., located in Santa Clara, Calif. Another example of a polishing head that may be adapted to benefit from the invention is described in U.S. Pat. No. 6,159,079, issued Dec. 12, 2001, which is hereby incorporated herein by reference in its entirety.

The basin 204 is generally fabricated from a plastic such as fluoropolymers, TEFLON® polymers, perfluoroalkoxy resin (PFA), polyethylene-based plastics (PE), sulfonated polyphenylether sulfones (PES), or other materials that are compatible or non-reactive with polishing compositions that may be used in electroplating or electropolishing. The basin 204 is rotationally supported above a base 206 by bearings 234. A drive system 236 is coupled to the basin 204 and rotates the basin 204 during processing. A catch basin 228 is disposed on the base 206 and circumscribes the basin 204 to collect processing fluids, such as a polishing composition, that flow out of port 218 disposed through the basin 204 during and/or after processing.

A polishing composition delivery system 232 is generally disposed adjacent the basin 204. The polishing composition delivery system 232 includes a nozzle or outlet 230 coupled to a polishing composition source 242. The outlet 230 flows polishing composition or other processing fluid from the polishing composition source 242 to into the basin 204. During processing, the polishing composition generally provides an electrical path for biasing the substrate 208 and driving an electrochemical process to remove and/or deposit material on the substrate 208. Alternatively, the polishing composition delivery system may provide polishing composition through the bottom 244 of the process cell and flow polishing composition through the pad assembly to contact the polishing pad and substrate. Alternatively, a recycling system might be used to recover and reuse the polishing composition. Further, a recirculation system may be used to extend the useful manufacturing life of the polishing composition for the same or additional processing steps.

Optionally, and shown in FIG. 1, a conditioning device 250 may be provided proximate the basin 204 to periodically condition or regenerate the pad assembly 222. Typically, the conditioning device 250 includes an arm 252 coupled to a stanchion 254 that is adapted to position and sweep a conditioning element 258 across pad assembly 222. The conditioning element 258 is coupled to the arm 252 by a shaft 256 to allow clearance between the arm 252 and sidewalls 246 of the basin 204 while the conditioning element 258 is lowered to contact the pad assembly 222. The conditioning element 258 is typically a diamond or silicon carbide disk, which may be patterned to enhance working the surface of the pad assembly 222 into a predetermined surface condition/state that enhances process uniformity. One conditioning element 258 that may be adapted to benefit from the invention is described in U.S. patent application Ser. No. 09/676,280, filed Sep. 28, 2000 by Li et al., now abandoned, which is incorporated herein by reference to the extent not inconsistent with the claims aspects and description herein.

A power source 224 is coupled to the pad assembly 222 by electrical leads 223A, 223B. The power source 224 applies an electrical bias to the pad assembly 222 to drive an electrochemical process as described further below. The 223A, 223B are routed through a slip ring 226 disposed below the basin 204. The slip ring 226 facilitates continuous electrical connection between the power source 224 and the pad assembly 222 as the basin 204 rotates. The leads 223A, 223B may be wires, tapes or other conductors compatible with process fluids or having a covering or coating that protects the leads from the process fluids. Examples of materials that may be utilized in the leads 223A, 223B include insulated copper, graphite, titanium, platinum, gold, and HASTELOY® among other materials. Coatings disposed around the leads may include polymers such as fluorocarbons, PVC, polyamide, and the like.

As the pad assembly 222 includes elements comprising both an anode and cathode of an electrochemical cell, both the anode and cathode may be replaced simultaneously by simply removing a used pad assembly 222 from the basin 204 and inserting a new pad assembly 222 with fresh electrical and supporting components into the basin 204.

The pad assembly 222 depicted includes a conductive pad 203 coupled to a backing 207. The backing 207 may be coupled to an electrode 209. A dielectric insert (not shown) may be disposed between the conductive pad 203 and the backing 207 or electrode 209 to regulate electrolyte flow through all or a portion of the conductive pad 203. The conductive pad 203 is used to apply a uniform bias to the substrate surface without the use of a conventional bias application apparatus, such as an edge contact. The electrode 209 is generally biased as a cathode through a connection to the power supply 224 via a lead, for example lead 223A, and the conductive pad 203, and substrate, is bias as an anode for anodic dissolution in an ECMP process.

Typically, the conductive pad 203, the backing 207, optionally, the dielectric insert, and the electrode 209 are secured together to form an unitary body that facilitates removal and replacement of the pad assembly 222 from the basin 204. Typically, the conductive pad 203, the backing 207, optionally the dielectric insert, and the electrode 209 are adhered or bonded to one another. Alternatively, the conductive pad 203, the backing 207, optionally the dielectric insert, and the electrode 209 may be coupled by other methods or combination thereof, including sewing, binding, heat staking, riveting, screwing and clamping among others. Examples of the conductive pad 203 are more fully disclosed in U.S. patent application Ser. No. 10/033,732, filed on Dec. 27, 2001, which is incorporated by reference herein to the extent not inconsistent with the claimed aspects and disclosure herein.

The face-down polishing apparatus is more fully disclosed in U.S. patent application Ser. No. 10/151,538, filed May 16, 2002, now published at United States Publication No. 2003/0213703 on Nov. 20, 2003, entitled "Method and Apparatus for Substrate Polishing," commonly assigned to Applied Materials Inc., of which paragraphs 25–81 are incorporated herein by reference to the extent not inconsistent with the claims aspects and description herein. Similarly to face-up polishing, relative motion is provided between the substrate and the electrode and/or pad.

The process cell 200 may be disposed on a polishing platform, such as the Reflexion® CMP System, the Mirra™CMP system, and the Mirra™ Mesa CMP System, which are commercially available from Applied Materials, Inc., of Santa Clara, Calif. Additionally, any system enabling electrochemical mechanical polishing using the method or composition described herein can be used to advantage.

Polishing Composition and Process

In one aspect, polishing compositions that can planarize metals, such as copper, are provided. Generally, the polishing composition comprises an acid based electrolyte system, one or more chelating agents, one or more corrosion inhibitors, one or more inorganic or organic acid salts, one or more pH adjusting agents, a pH between about 2 and about 10, a polishing enhancing material selected from the group of abrasive particles, one or more oxidizers, and combinations thereof and a solvent. It is believed that the polishing compositions described herein contribute to a improved polishing and effective removal rate of conductive materials, such as copper, during ECMP with effective planarization of substrates and smooth surfaces after polishing.

Although the polishing compositions are particularly useful for removing copper, it is believed that the polishing compositions also may be used for the removal of other conductive materials, such as aluminum, platinum, tungsten, titanium, titanium nitride, tantalum, tantalum nitride, cobalt, gold, silver, and combinations thereof. Other material used in forming conductive material features on a substrate surface include barrier layer materials, for example, tantalum, tantalum nitride, titanium, and titanium nitride, may be removed by the processes described herein. Mechanical abrasion, such as from contact with the polishing pad and/or abrasives, may be used to improve planarity and removal of conductive materials and also remove dielectric materials including carbon doped silicon oxide and doped or undoped silicon carbide.

The polishing composition includes an acid based electrolyte system for providing electrical conductivity. Suitable acid based electrolyte systems include, for example, sulfuric acid based electrolytes, phosphoric acid based electrolytes, perchloric acid based electrolytes, acetic acid based electrolytes, and combinations thereof. Suitable acid based electrolyte systems include an acid electrolyte, such as phosphoric acid and sulfuric acid, as well as acid electrolyte derivatives, including ammonium and potassium salts thereof. The acid based electrolyte system may also buffer the composition to maintain a desired pH level for processing a substrate.

Examples of suitable acid based electrolytes include compounds having a phosphate group ($PO_4^{3-}$), such as, phosphoric acid, potassium phosphate ($K_3PO_4$), copper phosphate, ammonium dihydrogen phosphate ($NH_4H_2PO_4$), diammonium hydrogen phosphate (($NH_4$)$HPO_4$), and compounds having a sulfate group ($SO_4^{3-}$), such as sulfuric acid, ammonium hydrogen sulfate (($NH_4$)$_2HSO_4$), copper sulfate, or combinations thereof. The invention also contemplates that conventional electrolytes known and unknown may also be used in forming the composition described herein using the processes described herein.

Alternatively, the acid based electrolyte system may be provided in an amount between about 1 and about 30 percent by weight (wt. %) or volume (vol %) of the composition to provide suitable conductivity for practicing the processes described herein. For example, dihydrogen phosphate and/or diammonium hydrogen phosphate may be present in the composition in amounts between about 15 and about 25 percent by weight or volume of the solution. Phosphoric acid may be present in concentrations up to 30 wt. %, for example, between about 2 wt. % and about 6 wt. %.

In any of the embodiments described herein, the chelating agents can bind to a conductive material, such as copper ions, increase the removal rate of metal materials, and may also be used to buffer or adjust the polishing composition to maintain a desired pH level for processing a substrate.

The one or more chelating agents can include compounds having one or more functional groups selected from the group of amine groups, amide groups, carboxylate groups, dicarboxylate groups, tri-carboxylate groups, hydroxyl groups, a mixture of hydroxyl and carboxylate groups, and combinations thereof. The one or more chelating agents may also include salts of the chelating agents described herein. The metal materials for removal, such as copper, may be in any oxidation state, such as 0, 1, or 2, before, during or after ligating with a functional group. The functional groups can bind the metal materials created on the substrate surface during processing and remove the metal materials from the substrate surface.

The polishing composition may include one or more chelating agents at a concentration between about 0.1% and about 15% by volume or weight, for example, between about 0.1% and about 4% by volume or weight. For example, about 2% by volume or weight of ethylenediamine may be used as a chelating agent.

Examples of suitable chelating agents include compounds having one ore more amine and amide functional groups, such as ethylenediamine, diethylenetriamine, diethylenetriamine derivatives, hexadiamine, amino acids, ethylenediaminetetraacetic acid, methylformamide, or combinations thereof.

Examples of suitable chelating agents having one or more carboxylate groups include citric acid, tartaric acid, succinic acid, oxalic acid, and combinations thereof. Other suitable acids having one or more carboxylate groups include acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, and combinations thereof.

In any of the embodiments described herein, the inorganic or organic acid salts may perform as a chelating agent. The polishing composition may include one or more inorganic or organic salts at a concentration between about 0.1% and about 15% by volume or weight of the composition, for example, between about 0.1% and about 6% by volume or weight. For example, about 2% by volume or weight of ammonium citrate may be used in the polishing composition.

Examples of suitable inorganic or organic acid salts include ammonium and potassium salts or organic acids, such as ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof. Additionally, ammonium and potassium salts of the carboxylate acids described herein may also be used as the organic acid salts in the compositions described herein.

In any of the embodiments described herein, the corrosion inhibitors can prevent the oxidation or corrosion of metal surfaces by forming a layer of material to reduce or minimize chemical interaction between material deposited on a substrate surface and the surrounding electrolyte. The layer of material formed by the corrosion inhibitors insulates the surface from the surrounding electrolyte, and thus, suppresses or minimizes the electrochemical current from the substrate surface to limit electrochemical deposition and/or dissolution. The polishing composition may include between about 0.001% and about 5.0% by weight of the organic compound having azole groups, for example, between about 0.2% and about 0.4% by weight.

The one or more corrosion inhibitors can include an organic compound having one or more azole groups. Examples of organic compounds having azole groups include benzotriazole, mercaptobenzotriazole, 5-methyl-1-benzotriazole, and combinations thereof. Other suitable corrosion inhibitors include film forming agents that are cyclic compounds, for example, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. Other corrosion inhibitors include urea and thiourea among others.

Alternatively, polymeric inhibitors, for non-limiting examples, polyalkylaryl ether phosphate or ammonium nonylphenol ethoxylate sulfate, may be used in replacement or conjunction with azole containing corrosion inhibitors in an amount between about 0.002% and about 1.0% by volume or weight of the composition.

The one or more pH adjusting agents contribute to the pH adjustment of the polishing composition. The preferred pH of the polishing composition may be between about 2 and about 10, for example, between a pH of about 4 and about 6. The polishing composition may include up to about 70 wt. % of the one or more pH adjusting agents, for example, between about 0.2% and about 25% by volume or weight of the one or more pH adjusting agents. Different compounds may provide different pH levels for a given concentration, for example, the composition may include between about 0.1% and about 10% by volume of a base, such as potassium hydroxide, ammonium hydroxide, or combinations thereof, to provide the desired pH level.

The one or more pH adjusting agents that can be organic acids, for example, carboxylic acids, such as acetic acid, citric acid, oxalic acid, phosphate-containing components including phosphoric acid, ammonium phosphates, potassium phosphates, and combinations thereof, or a combination thereof. Inorganic acids, such as strong acids including sulfuric acid, nitric acid, and combinations thereof, may also be used in the polishing composition.

The one or more pH adjusting agents may also include a base, for example, potassium hydroxide, ammonium hydroxide, or combinations thereof. The amount of base used in the polishing composition is typically the amount required to adjust the pH of the composition to the desired level between about 2 and about 10.

Alternatively, the polishing composition may include a base and a compound selected from the group consisting of acetic acid, citric acid, oxalic acid, phosphoric acid, ammonium phosphates, potassium phosphates, or combinations thereof. In compositions which include both a base and a compound selected from the group identified herein, the composition may comprise between about 0.1% and about 10% by volume of the base, and between about 0.2% and about 25% by volume or weight of the compound selected from the group consisting of acetic acid, citric acid, oxalic acid, phosphoric acid, ammonium phosphates, potassium phosphates, or combinations thereof.

The polishing composition includes one or more polishing enhancing materials including abrasive particles, one or more oxidizers, and combinations thereof.

Abrasive particles may be used to improve the removal rate or removal of conductive materials from the substrate surface during polishing. Abrasive particles may comprise up to about 35 wt. % of the polishing composition during processing. A concentration between about 0.001 wt. % and about 5 wt. % of abrasive particles may be used in the polishing composition.

Suitable abrasives particles include inorganic abrasives, polymeric abrasives, and combinations thereof. Inorganic abrasive particles that may be used in the electrolyte include, but are not limited to, silica, alumina, zirconium oxide, titanium oxide, cerium oxide, germania, or any other abrasives of metal oxides, known or unknown, and have an average size between about 20 nm and about 1000 nm. Generally, suitable inorganic abrasives have a Mohs hardness of more than 6, and the invention contemplates the use of abrasives having a lower Mohs hardness in the polishing composition.

The polymer abrasives described herein may also be referred to as "organic polymer particle abrasives", "organic abrasives" or "organic particles." The polymeric abrasives may comprise abrasive polymeric materials. Examples of polymeric abrasives materials include polymethylmethacrylate, polymethyl acrylate, polystyrene, polymethacrylonitrile, and combinations thereof.

The polymeric abrasives may have a Hardness Shore D of between about 60 and about 80, and can vary to have greater or lesser hardness. The polymer abrasives may also be softer than the inorganic particles described herein, which can result in reduced friction between a polishing article and substrate and may result in a reduction in the number and the severity of scratches and other surface defects as compared to inorganic particles. The polymer abrasives may also be harder than the materials used in any polishing pad materials to provide improved polishing performance as compared to the polishing pad material alone.

The hardness of the polymer abrasives can be varied by controlling the extent of polymeric cross-linking in the abrasives, for example, a higher degree of cross-linking produces a greater hardness of polymer and, thus, abrasive. The polymeric abrasives are typically formed as spherical shaped beads having an average diameter between about 1 micron to about 20 microns, or less.

The polymeric abrasives may be modified to have functional groups, e.g., one or more functional groups, that have an affinity for, i.e., can bind to, the conductive material or conductive material ions which are to be removed from the substrate or composition, thereby facilitating the removal of a conductive material from the surface of a substrate during processing. For example, if copper is to be removed in the polishing process, the organic polymer particles can be modified to have an amine group, a carboxylate group, a pyridine group, a hydroxide group, ligands with a high affinity for copper, or combinations thereof, to bind the removed copper, for example, to be used in addition to, or as substitutes for, the chemically active agents in the composition, such as chelating agents. The metal materials for removal, such as copper, may be in any oxidation state, such as 0, 1, or 2, before, during or after ligating with a functional group. The functional groups can bind the metal materials created on the substrate surface during processing and remove the metal materials from the substrate surface.

Additionally, the polymeric abrasives have desirable chemical properties, for example, the polymer abrasives are stable over a broad pH range and are not prone to aggregating to each other, which allow the polymeric abrasives to be used with reduced or no surfactant or no dispersing agent in the composition.

Alternatively, inorganic particles coated with the polymeric materials described herein may also be used with the polishing composition. The abrasives used in the composition may be combinations of the polymeric abrasives, the inorganic abrasives, the polymeric coated inorganic abrasives, depending on the desired polishing performance and results.

One or more oxidizers may be used herein to enhance the removal or removal rate of the conductive material from the substrate surface. As used herein, an oxidizing agent is generally an agent that accepts electrons from the layer or layers of a substrate that is to be polished, oxidizes material thereon for more effective removal of the material. For example, an oxidizer may be used to oxidize a metal layer to a corresponding oxide or hydroxide, for example, copper to copper oxide. Existing copper that has been oxidized, including $Cu^{1+}$ ions, may further be oxidized to a higher oxidation state, such as $Cu^{2+}$ ions, which may then react with chelating agents.

The oxidizer can be present in the polishing composition in an amount ranging between about 0.01% and about 90% by volume or weight, for example, between about 0.1% and about 20% by volume or weight. In an embodiment of the polishing composition, between about 0.1% to about 15% by volume or weight of hydrogen peroxide is present in the polishing composition.

Examples of suitable oxidizers include peroxy compounds, e.g., compounds that may disassociate through hydroxy radicals, such as hydrogen peroxide and its adducts including urea hydrogen peroxide, percarbonates, and organic peroxides including, for example, alkyl peroxides, cyclical or aryl peroxides, benzoyl peroxide, peracetic acid, and di-t-butyl peroxide. Sulfates and sulfate derivatives, such as monopersulfates and dipersulfates may also be used including for example, ammonium peroxydisulfate, potassium peroxydisulfate, ammonium persulfate, and potassium persulfate. Salts of peroxy compounds, such as sodium percarbonate and sodium peroxide may also be used.

The oxidizing agent can also be an inorganic compound or a compound containing an element in its highest oxidation state. Examples of inorganic compounds and compounds containing an element in its highest oxidation state include but are not limited to periodic acid, periodate salts, perbromic acid, perbromate salts, perchloric acid, perchloric salts, perbonic acid, nitrate salts (such as cerium nitrate, iron nitrate, ammonium nitrate), perborate salts and permanganates. Other oxidizing agents include bromates, chlorates, chromates, iodates, iodic acid, and cerium (IV) compounds such as ammonium cerium nitrate.

The balance or remainder of the polishing compositions described above is a solvent, such as a polar solvent, including water, preferably deionized water, and organic solvents, for example, alcohols or glycols.

Further, controlling the amounts and types of constituents of the polishing composition, such as corrosion inhibitors and oxidizers, can result in tuning the desired removal rate of the process. For example reduced amounts of corrosion inhibitor will result in increase removal rates compared to compositions having higher corrosion inhibitor rates; and reduced amounts of oxidizers will result in lower removal rates compared to compositions having higher oxidizer compositions.

An example of a polishing composition described herein includes about 2% by volume ethylenediamine, about 2% by weight ammonium citrate, about 0.3% by weight benzotriazole, between about 0.1% and about 3% by volume or weight, for example, about 0.45% hydrogen peroxide, and/or about between about 0.01% and 1% by weight, for example 0.15% by weight, of abrasive particles, and about 6% by volume phosphoric acid. The pH of the composition is about 5, which may be achieved by, for example, the composition further including potassium hydroxide to adjust the pH to the preferred range. The remainder of the polishing composition is deionized water.

Alternatively, the polishing composition may further include electrolyte additives including suppressors, enhancers, levelers, brighteners, stabilizers, and stripping agents to improve the effectiveness of the polishing composition in polishing of the substrate surface. For example, certain additives may decrease the ionization rate of the metal atoms, thereby inhibiting the dissolution process, whereas other additives may provide a finished, shiny substrate surface. The additives may be present in the polishing composition in concentrations up to about 15% by weight or volume, and may vary based upon the desired result after polishing.

For example, one or more surfactants may be used in the polishing composition. Surfactants may be used to increase the dissolution or solubility of materials, such as metals and metal ions or by-products produced during processing, reduce any potential agglomeration of abrasive particles in the polishing composition, and improve chemical stability and reduce decomposition of components of the polishing composition. The one or more surfactants can comprise a concentration between about 0.001% and about 10% by volume or weight of the polishing composition. A concentration between about 0.01% and about 2% by volume or weight, for example between about 0.1% and about 1% by volume or weight, of the surfactants may be used in one embodiment of the polishing composition.

The one or more surfactants may include non-ionic surfactants as well as ionic surfactants including anionic surfactants, cationic surfactants, amphoteric surfactants, and ionic surfactants having more than one ionic functional group, such as Zweitter-ionic surfactants. Dispersers or dispersing agents are considered to be surfactants as surfactants are used herein. Compositions containing the polymeric abrasives are stable over a broad pH range and are not prone to aggregating to each other, which allow the polymeric abrasives to be used with reduced or no surfactant or no dispersing agent in the composition.

Other examples of additives include one or more leveling agents, which are broadly defined herein as additives that suppress dissolution current on the surface of a substrate. Leveling agents suppress dissolution current by attaching to conductive materials, by inhibiting the electrochemical reactions between the electrolyte and conductive material, and/or form depolarizing agents that limit electrochemical reactions. A concentration of leveling agents between about 0.005% and about 10% by volume or weight, for example, between about 0.05% and about 2% by volume or weight of the electrolyte solution can be used.

Leveling agents include, but are not limited to, polyethylene glycol and polyethylene glycol derivatives. Other leveling agents which can be employed in the process described herein include any employed in the electroplating art, such as polyamines, polyamides and polyimides including polyethyleneimine, polyglycine, 2-amino-1-naphthalenesulfonic acid, 3-amino-1-propanesulfonic acid, 4-aminotoluene-2-sulfonic acid.

Suppressors, such as electrically resistive additives that reduce the conductivity of the polishing composition may be added to the composition in an amount between about 0.005% and about 2% by volume or weight of the composition. Suppressors include polyacrylamide, polyacrylic acid polymers, polycarboxylate copolymers, coconut diethanolamide, oleic diethanolamide, ethanolamide derivatives, or combinations thereof One or more stabilizers may be present in an amount that is sufficient to produce measurable improvements in composition stability. The one or more stabilizers may be present in an amount ranging from about 100 ppm to about 5.0 weight percent (wt. %). Non-limiting examples of preferred stabilizers include but are not limited to phosphoric acids and phosphoric acid derivatives including aminotri(methylenephosphonic) acid, 1-hydroxyethylidene-4-diphosphonic acid, hexamethylenediaminetetramethylene phosphoric acid, and diethylenetetramine pentamethylenephosphonic acid, and derivative salts thereof.

Accelerators are another example of an additive that may be included in the polishing composition. Accelerators increase electrochemical reactions of metals disposed on the substrate surface to increase metal removal. The composition may include one or more accelerators at a concentration between about 0.1% and about 1% by volume or weight, for example between about 0.25 and about 0.8% by volume or weight. Accelerators may include sulfur containing compounds, such as sulfite or di-sulfate.

Further examples of additives to the polishing composition are more fully described in U.S. patent application Ser. No. 10/141,459, filed on May 7, 2002, now U.S. Pat. No. 6,863,797, which is incorporated by reference herein to the extent not inconsistent with the claimed aspects and disclosure herein.

It has been observed that substrate processed with the polishing composition described herein has improved surface finish, including less surface defects, such as dishing, erosion (removal of dielectric material surrounding metal features), and scratches, as well as improved planarity

POWER APPLICATION AND PROCESSING

Power may be applied to the substrate having a conductive material layer formed thereon in a process apparatus, such as cell 200 described above, by applying a bias between an electrode and the substrate to remove the conductive material.

In an example of a polishing process, a substrate 208 is disposed in the polishing head 202 used in a planarization process as shown in FIG. 1. The polishing head 202 may be contacted with a polishing pad assembly 222 to apply a pressure in the range between about 0.01 psi and about 1 psi, for example between about 0.1 psi and about 0.5 psi, to the substrate surface to be electrochemically and mechanically polished.

The polishing pad assembly 222 is disposed in a basin containing an electrolyte described herein. The substrate 208 is exposed to the polishing composition and electrically contacted with conductive pad 203. A bias from a power source 224 is then applied between the substrate 208 and the conductive pad 203. The bias is generally provided to produce anodic dissolution of the conductive material from the surface of the substrate at a current density up to about 100 milliamps/cm$^2$ to include processing of substrate up to about 300 mm, for example, between about 0.01 and about 40 milliamps/cm$^2$ for a 200 mm substrate.

The bias may be varied in power and application depending upon the user requirements in removing material from the substrate surface. The bias may also be applied by an electrical pulse modulation technique, which applies a constant current density or voltage for a first time period, then applies a constant reverse current density or voltage for a second time period, and repeats the first and second steps, as is described in co-pending U.S. Pat. No. 6,379,223, entitled "Method And Apparatus For Electrochemical Mechanical Planarization", issued on Apr. 22, 2002, which is incorporated by reference herein to the extent not inconsistent with the claimed aspects and disclosure herein.

The bias is generally applied to the substrate surface exposed to the polishing composition to remove copper containing material at a rate of about 15,000 Å/min, such as between about 100 Å/min and about 15,000 Å/min. In one embodiment of the invention where the copper material to be removed is less than 5,000 Å thick, the voltage may be applied to provide a removal rate between about 100 Å/min and about 5,000 Å/min.

The substrate is typically exposed to the polishing composition and power application for a period of time sufficient to remove at least a portion or all of the desired material disposed thereon.

While the exact mechanism for planarizing the substrate is unknown, it is believed that the planarization process is as follows. A passivation layer which chemically and/or electrically insulates the surface of the substrate is formed from the exposure of the substrate surface to the corrosion inhibitor, or other materials capable of forming a passivating or insulating film with the material to be removed, for example oxidizers, which can form oxidized layers, and/or chelating agents, which can for chelating layers. A bias is applied to remove material or enhance removal of conductive material, such as copper-containing material, from the substrate surface by anodic dissolution.

The passivation layer insulates or suppresses the current for anodic dissolution, and mechanical abrasion is provided between the substrate and permeable disk to remove the passivation layer from areas of contact between the permeable disk and the substrate, such as from peaks formed on the substrate surface from excessive deposition or topography of underlying layers, and expose the underlying copper-containing material. The passivation layer is retained in areas of minimal or no contact, such as recesses or valleys in the substrate surface. The exposed copper-containing material is then electrically connected with the electrolyte solution and may be removed by anodic dissolution.

The selective removal of the passivation layer from peaks by contact with a polishing article, for example, conductive pad 203 under the applied bias while retaining the passivation layer in valleys, allows for increased dissolution and/or removal of excessive copper-containing materials from passivation-free portions of the substrate surface in relation to the removal of the conductive materials underlying the passivation layer. The increased dissolution and removal of the copper-containing materials without a passivation layer formed thereon allows for increased reduction of the peaks formed on the substrate surface compared to the valleys formed thereon, resulting in enhanced planarization of the substrate surface.

Additionally, removal of material by polishing and anodic dissolution allows for the substrate surface to be planarized with lower polishing pressures (i.e., about 2 psi or less) than conventional polishing. Lower polishing pressures correspond to lower shear forces and frictional forces which make this process suitable for planarizing substrate surfaces sensitive to contact pressures between the substrate and polishing pads, such as polishing low k dielectric materials, with reduced or minimal deformations and defect formation from polishing. Further, the lower shear forces and frictional forces have been observed to reduce or minimize formation of topographical defects, such as dishing and scratches, during polishing.

EXAMPLES

The following non-limiting examples are provided to further illustrate embodiments of the invention. However, the examples are not intended to be all inclusive and are not intended to limit the scope of the invention described herein.

Example 1

A copper plated wafer was polished and planarized using the following polishing composition within a modified cell on a Reflection® system, available from Applied Materials, Inc. of Santa Clara, Calif.

about 6% by volume phosphoric acid;
about 2% by volume ethylenediamine;
about 2% by weight ammonium citrate;
about 0.3% by weight benzotriazole;
between about 2% and about 6% potassium hydroxide to provide a pH of about 5;
about 0.45% by volume of hydrogen peroxide; and
deionized water.

Example 2

A copper plated wafer was polished and planarized using the following polishing composition within a modified cell on a Reflection® system, available from Applied Materials, Inc. of Santa Clara, Calif.

about 6% by volume phosphoric acid;
about 2% by volume ethylenediamine;
about 2% by weight ammonium citrate;
about 0.3% by weight benzotriazole;
between about 2% and about 6% potassium hydroxide to provide a pH of about 5;
about 0.45% by volume of hydrogen peroxide;
about 0.15% by weight of silica ($SiO_2$) abrasive particles; and
deionized water.

Example 3

A copper plated wafer was polished and planarized using the following polishing composition within a modified cell on a Reflection® system, available from Applied Materials, Inc. of Santa Clara, Calif.

about 6% by volume phosphoric acid;
about 2% by volume ethylenediamine;
about 2% by weight ammonium citrate;
about 0.3% by weight benzotriazole;
between about 2% and about 6% potassium hydroxide to provide a pH of about 6;
about 0.1% by weight of silica ($SiO_2$) abrasive particles; and deionized water.

While the foregoing is directed to embodiments of the present invention, other and further embodiments of the invention may be devised without departing from the basic scope thereof, and the scope thereof is determined by the claims that follow.

What is claimed is:

1. A composition for removing at least a conductive material from a substrate surface, comprising:
   an acid based electrolyte system;
   one or more chelating agents having one or more functional groups selected from the group consisting of amine groups, amide groups, and combinations thereof;
   one or more corrosion inhibitors;
   one or more organic acid salts;
   one or more basic pH adjusting agents to provide a pH between about 4 and about 6;
   abrasive particles;
   one or more oxidizers; and
   a solvent.

2. The composition of claim 1, wherein the acid based electrolyte system is selected from the group of phosphoric acid based electrolytes, sulfuric acid based electrolytes, perchloric acid based electrolytes, acetic acid based electrolytes, and combinations thereof.

3. The composition of claim 1, wherein the one or more chelating agents further include a compound having one or more functional groups selected from the group consisting of carboxylate groups, dicarboxylate groups, tricarboxylate groups, and combinations thereof.

4. The composition of claim 3, wherein the compound comprises ethylenediaminetetraacetic acid, methylformamide, citric acid, tartaric acid, succinic acid, oxalic acid, acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, and combinations thereof.

5. The composition of claim 1, wherein the one or more chelating agents are selected from the group consisting of ethylenediamine, hexadiamine, amino acids, methylformamide, and combinations thereof.

6. The composition of claim 1, wherein the one or more corrosion inhibitors have one or more azole groups.

7. The composition of claim 6, wherein the one or more corrosion inhibitors are selected from the group consisting of benzotriazole, imidazole, benzimidazole, triazole, and derivatives of benzotriazole, imidazole, benzimidazole, triazole, with hydroxy, amino, imino, carboxy, mercapto, nitro and alkyl substituted groups, and combinations thereof.

8. The composition of claim 1, wherein the one or more organic salts comprises ammonium salts of organic acids, potassium salts of organic acids, or combinations thereof.

9. The composition of claim 8, wherein the one or more organic salts are selected from the group of ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof.

10. The composition of claim 1, wherein the one or more basic pH adjusting agents comprise:
   one or more bases selected from the group of potassium hydroxide, ammonium hydroxide, and combinations thereof.

11. The composition of claim 1, wherein the abrasives comprise inorganic abrasives, polymeric abrasives, or combinations thereof.

12. The composition of claim 1, wherein the one or more oxidizers are selected from the group of peroxy compounds, salts of peroxy compounds, organic peroxides, sulfates, derivatives of sulfates, compounds containing an element in the highest oxidation state, and combinations thereof.

13. The composition of claim 1, wherein the composition comprises:
   between about 1% and about 30% by weight (wt. %) in volume of total composition of the acid based electrolyte system;
   between about 0.1% and about 15% by volume or weight of the one or more chelating agents;
   between about 0.01% and about 1.0% by volume or weight of the one or more corrosion inhibitors;
   between about 0.1% and about 15% by volume or weight of the one or more inorganic or organic acid salts;
   between about 0.1% and about 25% by volume or weight of the pH adjusting agent;
   between about 0.001 and about 30 by weight of abrasive particles;
   between about 0.1% and about 25% by volume or weight of the one or more oxidizers; and
   the remainder a solvent.

14. The composition of claim 1, wherein the composition comprises:
   about 6% by volume phosphoric acid;
   about 2% by volume ethylenediamine;
   about 0.3% by weight benzotriazole;
   about 2% by weight ammonium citrate;
   between about 2% and about 6% by volume of potassium hydroxide to provide a pH of about 5;
   between about 0.1% and about 0.15% by weight of silica abrasives;
   about 0.45% by volume of hydrogen peroxide; and
   deionized water.

15. A method of processing a substrate, comprising:
   disposing a substrate having a conductive material layer formed thereon in a process apparatus comprising a first electrode and a second electrode, wherein the substrate is in electrical contact with the second electrode;
   providing a polishing composition between the first electrode and the substrate, wherein the polishing composition comprises:
      an acid based electrolyte system;
      one or more chelating agents having one or more functional groups selected from the group consisting of amine groups, amide groups, and combinations thereof;
      one or more corrosion inhibitors;
      one or more organic acid salts;
      one or more basic pH adjusting agents to provide a pH between about 4 and about 6;
      abrasive particles;
      one or more oxidizers; and
      a solvent;
   forming a passivation layer on a substrate surface;
   contacting the substrate surface with a conductive polishing article in the presence of the polishing composition to remove at least a portion of the passivation layer, wherein the conductive polishing article is in contact with a first electrode;
   applying a bias between the first electrode and the second electrode; and
   removing conductive material from the conductive material layer.

16. The method of claim 15, wherein the bias is applied to the substrate to initiate an anodic dissolution at a current density between about 0.01 milliamps/cm$^2$ and about 100 milliamps/cm$^2$.

17. The method of claim 15, wherein the acid based electrolyte system is selected from the group of phosphoric acid based electrolytes, sulfuric acid based electrolytes, perchloric acid based electrolytes, acetic acid based electrolytes, and combinations thereof.

18. The method of claim 15, wherein the one or more chelating agents further include a compound having one or more functional groups selected from the group consisting of carboxylate groups, dicarboxylate groups, tricarboxylate groups, and combinations thereof.

19. The method of claim 18, wherein the compound comprises ethylenediaminetetraacetic acid, methylformamide, citric acid, tartaric acid, succinic acid, oxalic acid, acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, and combinations thereof.

20. The method of claim 15, wherein the one or more chelating agents are selected from the group consisting of ethylenediamine, hexadiamine, amino acids, methylformamide and combinations thereof.

21. The method of claim 15, wherein the one or more corrosion inhibitors have one or more azole groups.

22. The method of claim 21, wherein the one or more corrosion inhibitors are selected from the group consisting of benzotriazole, imidazole, benzimidazole, triazole, and derivatives of benzotriazole, imidazole, benzimidazole, triazole, with hydroxy, amino, imino, carboxy, mercapto, nitro and alkyl substituted groups, and combinations thereof.

23. The method of claim 15, wherein the one or more organic salts comprises ammonium salts of organic acids, potassium salts of organic acids, or combinations thereof.

24. The method of claim 23, wherein the one or more organic salts are selected from the group of ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof.

25. The method of claim 15, wherein the one or more basic pH adjusting agents comprise:

one or more bases selected from the group of potassium hydroxide, ammonium hydroxide, and combinations thereof.

26. The method of claim 15, wherein the abrasives comprise inorganic abrasives, polymeric abrasives, or combinations thereof.

27. The method of claim 15, wherein the one or more oxidizers are selected from the group of peroxy compounds, salts of peroxy compounds, organic peroxides, sulfates, derivatives of sulfates, compounds containing an element in the highest oxidation state, and combinations thereof.

28. The method of claim 15, wherein the composition comprises:
between about 1% and about 30% by weight (wt. %) in volume of total composition of the acid based electrolyte system;
between about 0.1% and about 15% by volume or weight of the one or more chelating agents;
between about 0.01% and about 1.0% by volume or weight of the one or more corrosion inhibitors;
between about 0.1% and about 15% by volume or weight of the one or more inorganic or organic acid salts;
between about 0.1% and about 25% by volume or weight of the pH adjusting agent;
between about 0.01 and about 30 by weight of abrasive particles;
between about 0.1% and about 25% by volume or weight of the one or more oxidizers; and
the remainder a solvent.

29. The method of claim 15, wherein the composition comprises:
about 6% by volume phosphoric acid
about 2% by volume ethylenediamine;
about 0.3% by weight benzotriazole;
about 2% by weight ammonium citrate;
between about 2% and about 6% by volume of potassium hydroxide to provide a pH of about 5;
between about 0.1% and about 0.15% by weight of silica abrasives;
about 0.45% by volume of hydrogen peroxide; and
deionized water.

* * * * *